US009318481B1

(12) United States Patent
Wang et al.

(10) Patent No.: US 9,318,481 B1
(45) Date of Patent: Apr. 19, 2016

(54) ELECTROSTATIC DISCHARGE PROTECTION DEVICE

(71) Applicant: Allegro Microsystems, LLC, Worcester, MA (US)

(72) Inventors: Zhixin Wang, Austin, TX (US); Juin Jei Liou, Oviedo, FL (US); Wei Liang, Orlando, FL (US); Richard B. Cooper, Shrewsbury, MA (US); Maxim Klebanov, Newton, MA (US); Harianto Wong, Southborough, MA (US)

(73) Assignee: Allegro Microsystems, LLC, Worcester, MA (US)

( * ) Notice: Subject to any disclaimer, the term of this patent is extended or adjusted under 35 U.S.C. 154(b) by 0 days.

(21) Appl. No.: 14/847,519

(22) Filed: Sep. 8, 2015

Related U.S. Application Data

(60) Provisional application No. 62/162,240, filed on May 15, 2015.

(51) Int. Cl.
*H01L 29/66* (2006.01)
*H01L 27/02* (2006.01)
*H01L 29/868* (2006.01)

(52) U.S. Cl.
CPC ........ *H01L 27/0262* (2013.01); *H01L 27/0255* (2013.01); *H01L 29/868* (2013.01)

(58) Field of Classification Search
CPC ............ H01L 27/0262; H01L 27/0266; H01L 2924/13034
USPC .......................... 257/173, 355, 360, 361, 356
See application file for complete search history.

(56) References Cited

U.S. PATENT DOCUMENTS

| 5,465,189 | A | 11/1995 | Polgreen et al. |
| 5,856,214 | A | 1/1999 | Yu |
| 6,081,002 | A | 6/2000 | Amerasekera et al. |
| 2007/0090392 | A1 | 4/2007 | Boselli |
| 2015/0236011 | A1 | 8/2015 | Wang et al. |

OTHER PUBLICATIONS

Wang et al., "Direct Connected Silicon Controlled Rectifier (SCR) Having Internal Trigger;" Patent Application filed on Feb. 13, 2015 for U.S. Appl. No. 14/621,766; 17 Pages.
Office Action dated Sep. 2, 2015 corresponding to U.S. Appl. No. 14/621,766; 7 Pages.
Response to Office Action dated Sep. 2, 2015 corresponding to U.S. Appl. No. 14/621,766; Response filed on Dec. 29, 2015; 9 Pages.

*Primary Examiner* — Tan N Tran
(74) *Attorney, Agent, or Firm* — Daly, Crowley, Mofford & Durkee, LLP

(57) ABSTRACT

In one aspect, a silicon-controller rectifier (SCR) includes a first N+ region; a first P+ region; a second N+ region; a second P+ region; and a P+/Intrinsic/N+ (PIN) diode disposed between the first P+ region and the second N+ region. The PIN diode includes a third N+ region, a third P+ region and an intrinsic material disposed between the third N+ region and the third P+ region. An anode terminal of the SCR connects to the first N+ region and the first P+ region and a cathode terminal of the SCR connects to the second N+ region and the second P+ region. A first distance between the third N+ region and the third P+ region controls the trigger voltage of the SCR and a second distance corresponding to a length of each of the third P+ region and the third N+ region controls the holding voltage of the SCR.

9 Claims, 10 Drawing Sheets

ELECTROSTATIC DISCHARGE PROTECTION DEVICE

RELATED APPLICATIONS

This application claims the benefit of U.S. Provisional Application No. 62/162,240 filed May 15, 2015, and entitled "ELECTROSTATIC DISCHARGE PROTECTION DEVICE," which is incorporated herein by reference in its entirety.

BACKGROUND

A silicon-controlled rectifier (SCR) (sometimes referred to as a thyristor) includes four semiconductor regions (e.g., NPNP or PNPN) and three junctions. Generally, the SCR includes three terminals (a cathode, an anode and a gate). The SCR may be configured to switch large levels of power. The SCR may be used in a variety of applications such as, for example, light dimmers, AC power switching and high-voltage direct current application.

SUMMARY

In one aspect, a silicon-controller rectifier (SCR) includes a first N+ region; a first P+ region; a second N+ region; a second P+ region; and a P+/Intrinsic/N+ (PIN) diode disposed between the first P+ region and the second N+ region. The PIN diode includes a third N+ region, a third P+ region and an intrinsic material disposed between the third N+ region and the third P+ region. An anode terminal of the SCR connects to the first N+ region and the first P+ region and a cathode terminal of the SCR connects to the second N+ region and the second P+ region. A first distance between the third N+ region and the third P+ region controls the trigger voltage of the SCR and a second distance corresponding to a length of each of the third P+ region and the third N+ region controls the holding voltage of the SCR.

The aspect above may include one or more of the following features. The SCR may further include an N-well coupled to the first N+ region and the first P+ region and the third N+ region; a first P-well and a second P-well having a higher doping than the first P-well and coupled to the second N+ region, second P+ region, the third P+ region and the first P well. The N-well may extend half the length of the third N+ region and the second P-well may extend to half the length of the third P+ region. A third distance is equal to a length of the third N+ region not directly connected to the N-well and the third distance is also equal to a length of the third P+ region not directly connected to the second P-well and the third distance may control the holding voltage of the SCR. The SCR may further include an N-type plug coupled to the N-well and the intrinsic material. The N-type plug may be further coupled to a deep N-well. The N-type plug may be further coupled to a P-substrate. The intrinsic region may be an N-type epitaxial material. The SCR may have no snapback.

DETAIL DESCRIPTION

Described herein are techniques to fabricate a no-snapback silicon-controlled rectifier (NS-SCR) device structure with an adjustable trigger voltage and an adjustable holding voltage for use as an electrostatic discharge (ESD) clamp.

Snapback means that, after triggered on by avalanche breakdown and impact ionization, the SCR exhibit a holding voltage smaller than trigger voltage. "No-snapback," as described herein, means that the holding voltage is equal or larger than the trigger voltage.

As used herein, the term "trigger voltage" is the voltage the SCR starts to conduct current using the parasitic bipolar actions. For example, in a PNPN structure: 1) when the anode-cathode forward voltage increase, the middle n-p junction is reverse biased. When this reverse voltage reach specific value, avalanche breakdown happens and generate free carriers; 2) these free carriers will start to forward bias the rest two p-n junctions in the SCR. However the amount of carriers are not good enough to turn on these two p-n junction. Therefore, the voltage will keep increasing and the avalanche breakdown becomes more and more strong; 3) when the generated free carriers reach specific amount which is good enough to turn on these two p-n junctions, the SCR start to conduct current. At this time the voltage can be regarded as trigger voltage; and 4) therefore, technically the avalanche breakdown voltage cannot be regarded as trigger voltage.

As used herein, the term "holding voltage" is the voltage that is needed to sustain the SCR/parasitic bipolar actions after the SCR is triggered on.

ESD induced failure is a major concern for the integrated circuits in advanced and main-stream technologies. This reliability issue is further worsened in high-voltage technologies because of the latch-up hazard. As will be further described herein a P+/Intrinsic/N+ (PIN) diode is embedded in the center of a traditional SCR serving as the trigger element. With this configuration the NS-SCR can work in different high voltage pins with high trigger voltage and low leakage current. Also, as further described herein the peak electric field is relocated from the traditional location to the PIN diode. This action separates the peak electric field from the major ESD current path, resulting in a high holding voltage which significantly lowers the risk of latch up.

Figure 1:
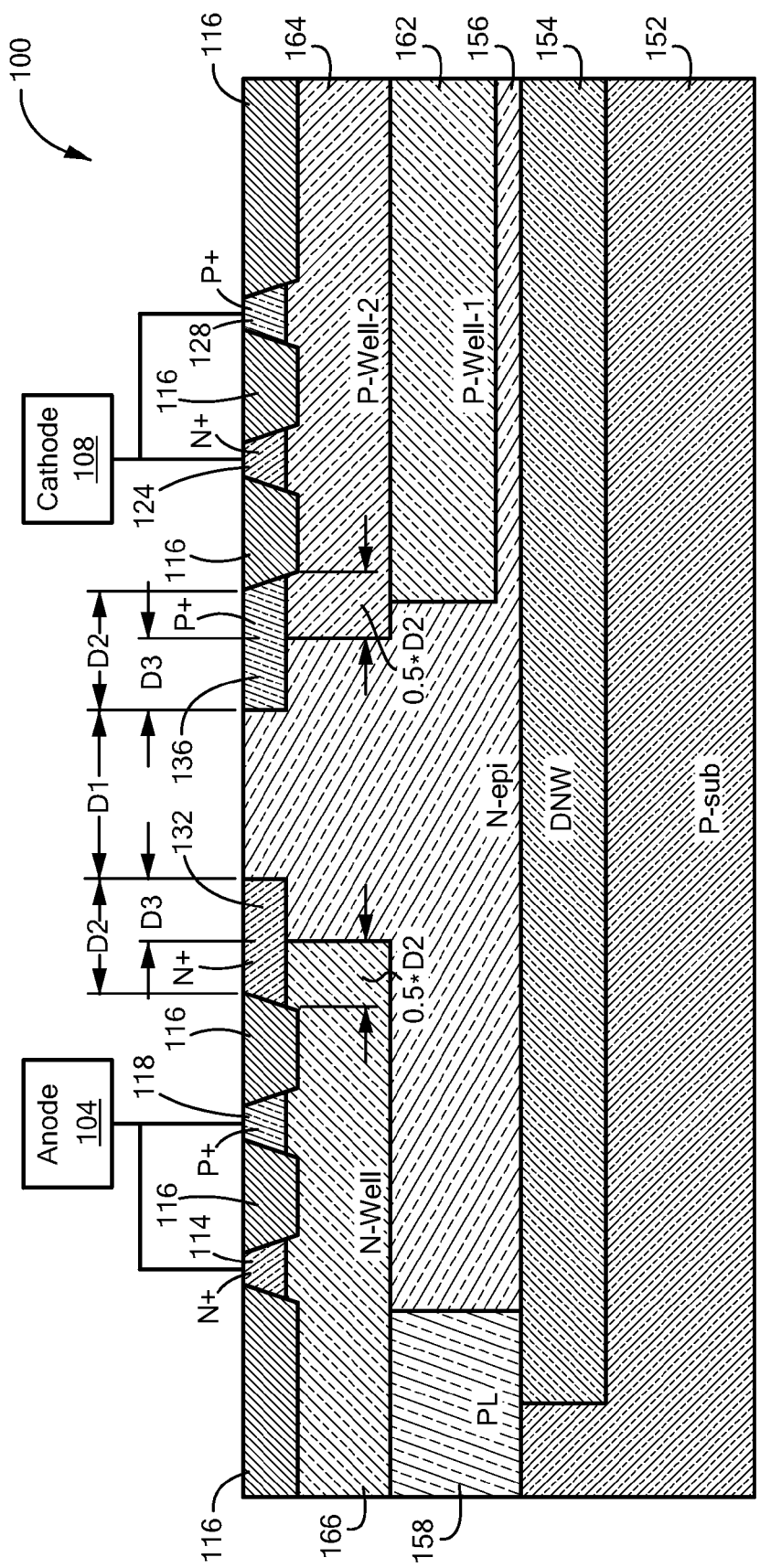
FIG. 1 is a block diagram of an example of a no snapback silicon-controlled rectifier (NS-SCR)
Figure 2:
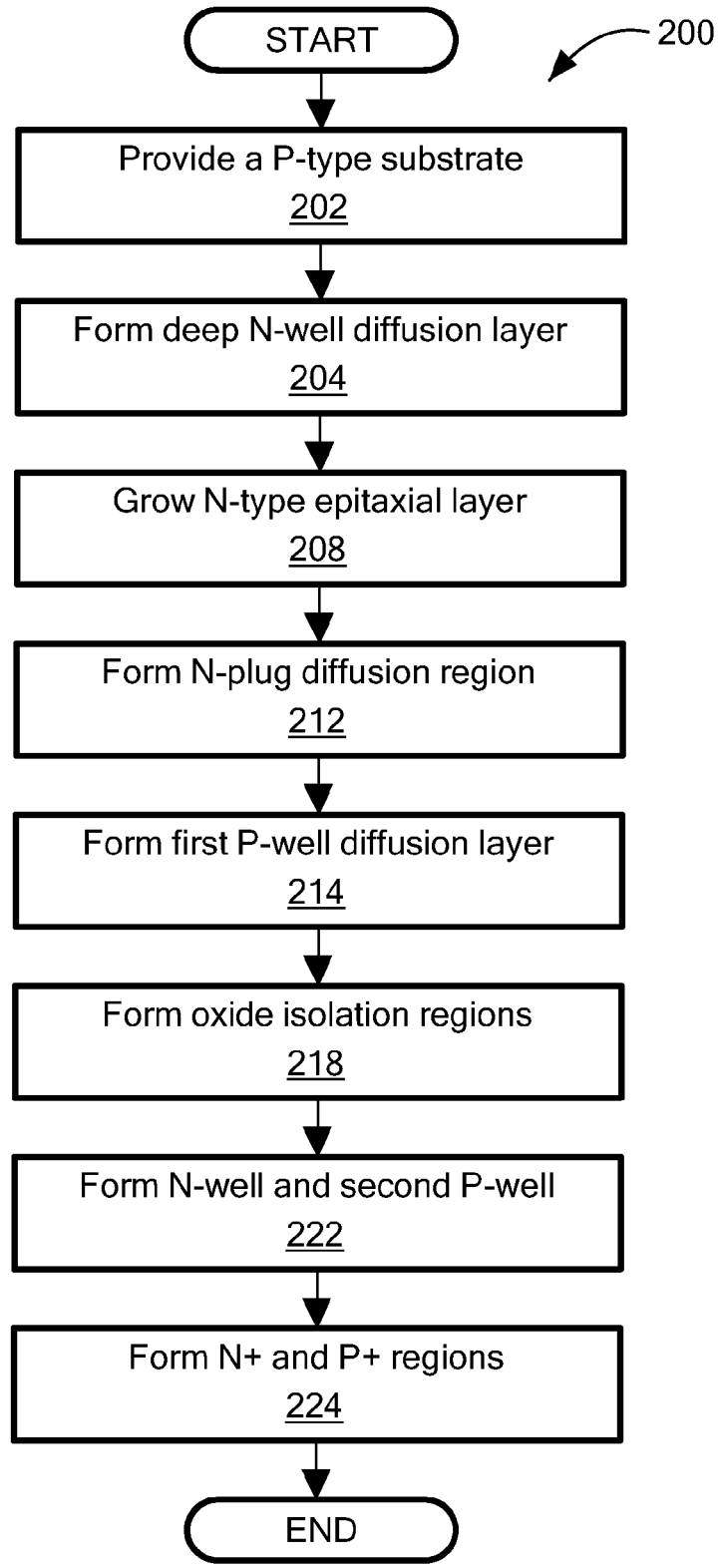
FIG. 2 is a flow diagram of an example of a process to fabricate the SCR of FIG. 1.

Referring to FIG. 1, an NC-SCR device 100 includes an anode 104 connected to an N+ region 114 and a P+ region 118, a cathode 108 connected to an N+ region 124 and a P+ region 128, an N-well 166, a first P-well 162, a second P-well 164, a deep N-well (DNW) diffusion layer 154 (as used herein DNW 154), a P-substrate 152 and an N-plug 158. The NC-SCR 100 also includes PIN diode components that include an N+ region 132 and a P+ region 136 separated by an intrinsic region (i.e., the N epitaxial material 156) to form a PIN diode. The PIN diode offers very good stability of breakdown and leakage currents even in a high temperature environment.

The NC-SCR 100 further includes oxide isolation regions 116 to isolate the N+ and P+ regions from one another except there is no oxide isolation region 116 between the N+ region 132 and the P+ region 136 of the PIN diode because they are separated by the intrinsic region (i.e., the N epitaxial material 156). In one example, the oxide isolation regions 116 are a field oxide (FOX). In another example, oxide isolation regions 116 are a shallow trench isolation (STI).

The distance between the N+ region 132 and the P+ region 136 or the length of the intrinsic region is a distance D1. The distance D1 controls the trigger voltage of the NS-SCR 100. That is, the NS-SCR 100 relies on the breakdown behavior of the PIN diode (N+ region 132, N epitaxial material 156 and P+ region 136). In general, increasing D1 increases the trigger voltage of the NS-SCR 100.

The length of the N+ region 132 and the length of P+ region 136 are both a distance D2. D2 is the dominant factor of the holding voltage of the NS-SCR 100. Generally, increasing D2 will increase the holding voltage.

In one example, the N-well 166 extends about 0.5*D2 underneath the N+ region 132 and the second P-well 164 extends about 0.5*D2 underneath the P+ region 136.

The distance between the edge of N+ region 132 and the N-epitaxial material 156 and the edge of the N-well 166 and the N-epitaxial material 156 is a distance D3. The distance between the edge of P+ region 136 and the N-epitaxial material 156 and the edge of the second P-well 164 and the N-epitaxial material 156 is also a distance D3. Generally, increasing D3 will also increase the holding voltage.

Because of the addition of the N+ region 132 and the P+ region 136, the peak electric field is relocated from the junction of the N-epitaxial material 156 and the second P-well 164 to the junction of the P+ region 136 and the N-epitaxial material 156. This characteristic separates the peak electric field from the main current path, which is from the P+ region 118 through the N-well 166 through the N-epitaxial material 156 through the second P-well 164 to the N+ region 124.

The advantages of adding the PIN diode in a traditional SCR include but are not limited to the introduction of adjustability of the trigger voltage and the holding voltage, and the absence of snapback behavior. On one hand, the intrinsic region (N-epitaxial material 156) in PIN diode will be completely depleted with high voltage drop, and thus it requires higher voltage than a traditional nip junction to trigger the SCR by an avalanche breakdown. On the other hand, the P+ region 136 moves the peak electric field from the n/p junction (i.e., the junction of the N-epitaxial material 156 and the second P-well 164) to the PIN diode (i.e., the junction of the P+ region 136 and the N-epitaxial material 156) in SCR. Therefore, unlike the traditional SCR, the electric field in the middle n/i/p junctions of NS-SCR (the junction of the N-well 166 and the N-epitaxial 156 and the junction of the first P-well 162 PW and the N-epitaxial 156) will be smaller than the critical breakdown voltage of silicon, such that these middle n/i/p junctions will not become strong conductivity modulations. Such a high electric field is maintained by a larger voltage drop. This, together with the mechanism that a large D2 reduces the current gains of the parasitic bipolar transistors in the NS-SCR because the N+ and P+ regions 132, 136 are major part of their base regions, results in a high holding voltage of the NS-SCR 100. Under normal operation, the PIN diode withstands the majority of DC voltage drop between the anode 104 and the cathode 108, leading to a low leakage current.

Figure 3A:
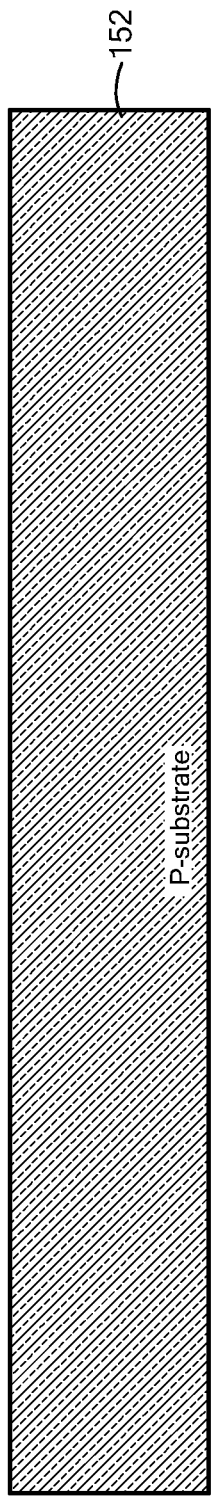
FIGS. 3A to 3H are block diagrams depicting stages of fabrication of the SCR using the process of FIG. 2.
Figure 3B:
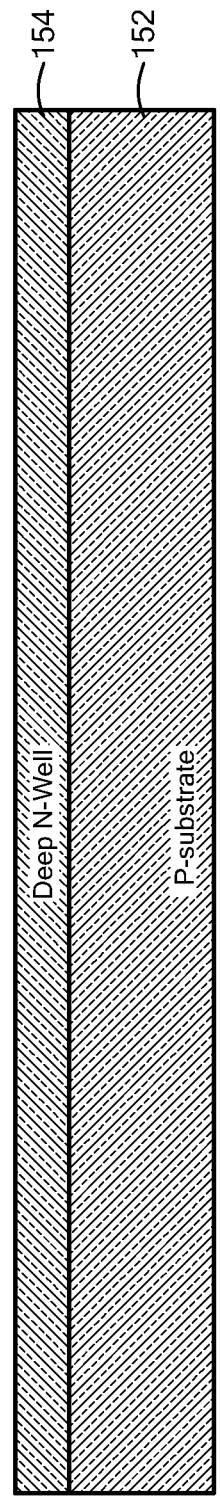
Figure 3C:
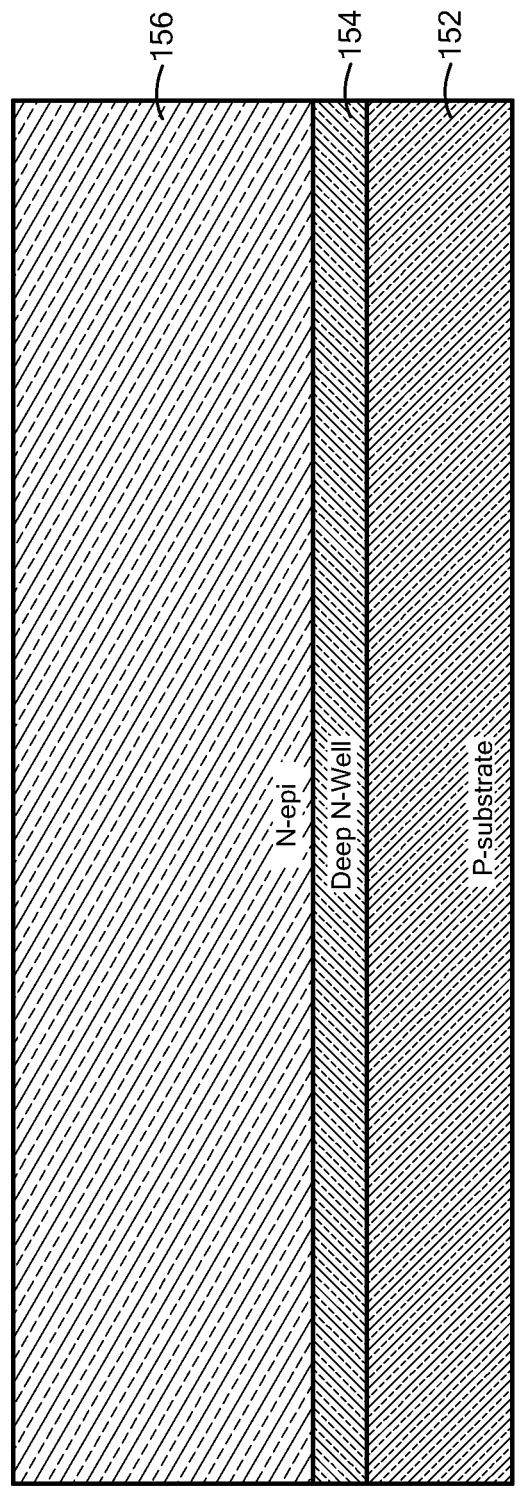

Referring to FIG. 2 and FIGS. 3A to 3H, a process 200 is an example of a process to fabricate the NS-SCR 100. Process 200 provides a P-type silicon substrate (202) and forms a DNW diffusion layer on the P-substrate (204). For example, a P-type silicon substrate 152 is provided (FIG. 3A) and the DNW 154 is diffused on the surface of the P-substrate 152 (FIG. 3B).

Figure 3D:
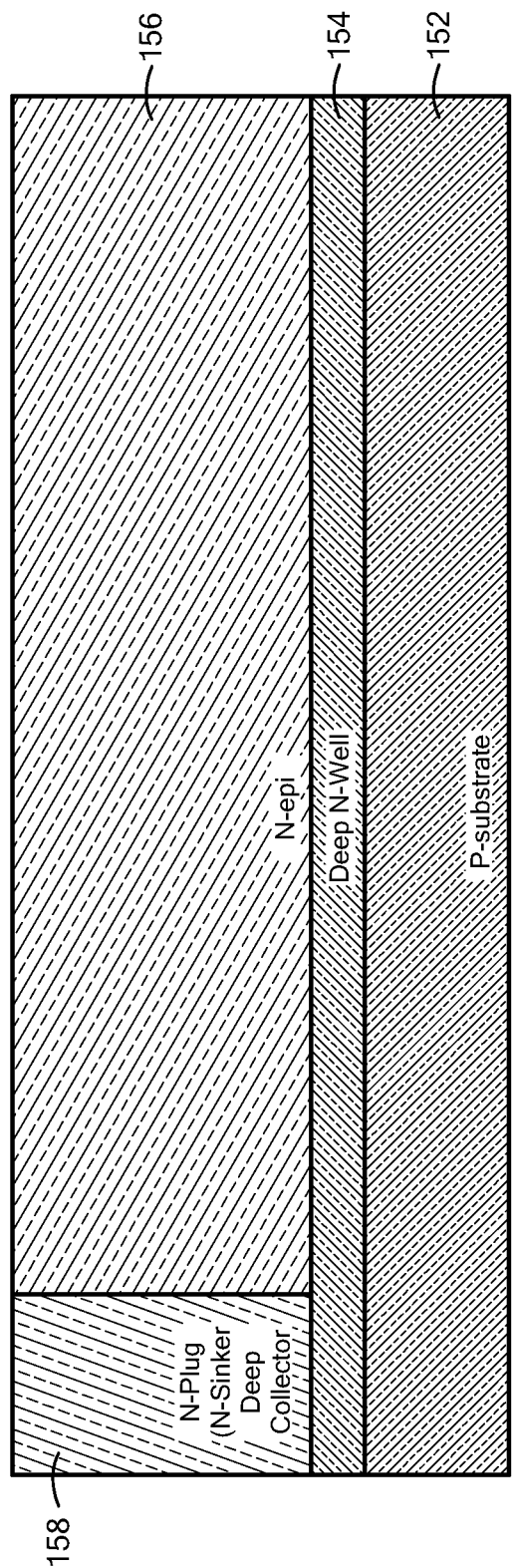

Process 200 grows an N-type epitaxial layer (208) and forms N-plug diffusion region (212). For example, an N epitaxial material 156 is grown on the DNW 154 (FIG. 3C) and N-plug 158 is diffused into the N-epitaxial material 156 (FIG. 3D). The N epitaxial material 156 is lightly doped (e.g., N epitaxial material is doped about 5e14 to 1e15 cm-3, which is about 1-2 order lower than the N-Well/P-Well doping concentrations) so it can be regarded as intrinsic.

Figure 3E:
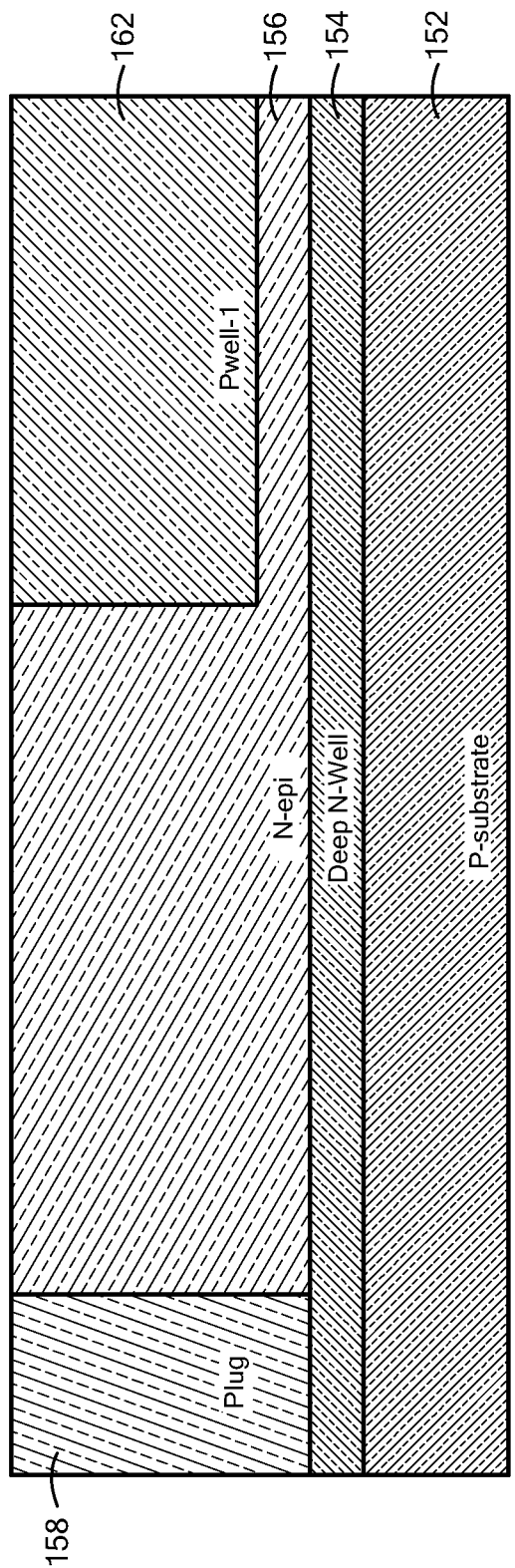
Figure 3F:
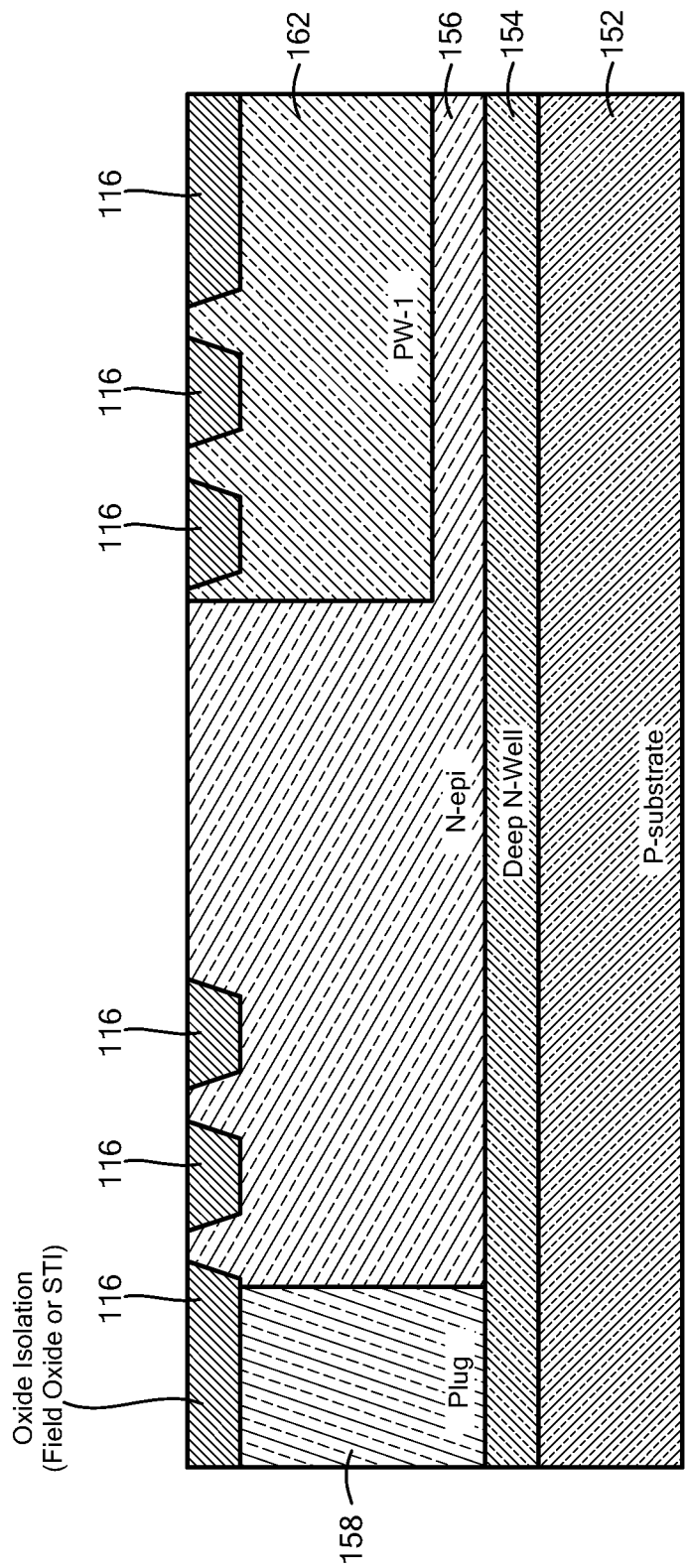

Process 200 forms a first P-well diffusion layer (214) and forms the oxide isolation regions (218). For example, the first P-well 162 is diffused into the N-epitaxial material 156 (FIG. 3E). The oxide regions 116 are formed in the N-plug 158, the N-epitaxial material 156 and the first P-well 162 (FIG. 3F).

Figure 3G:
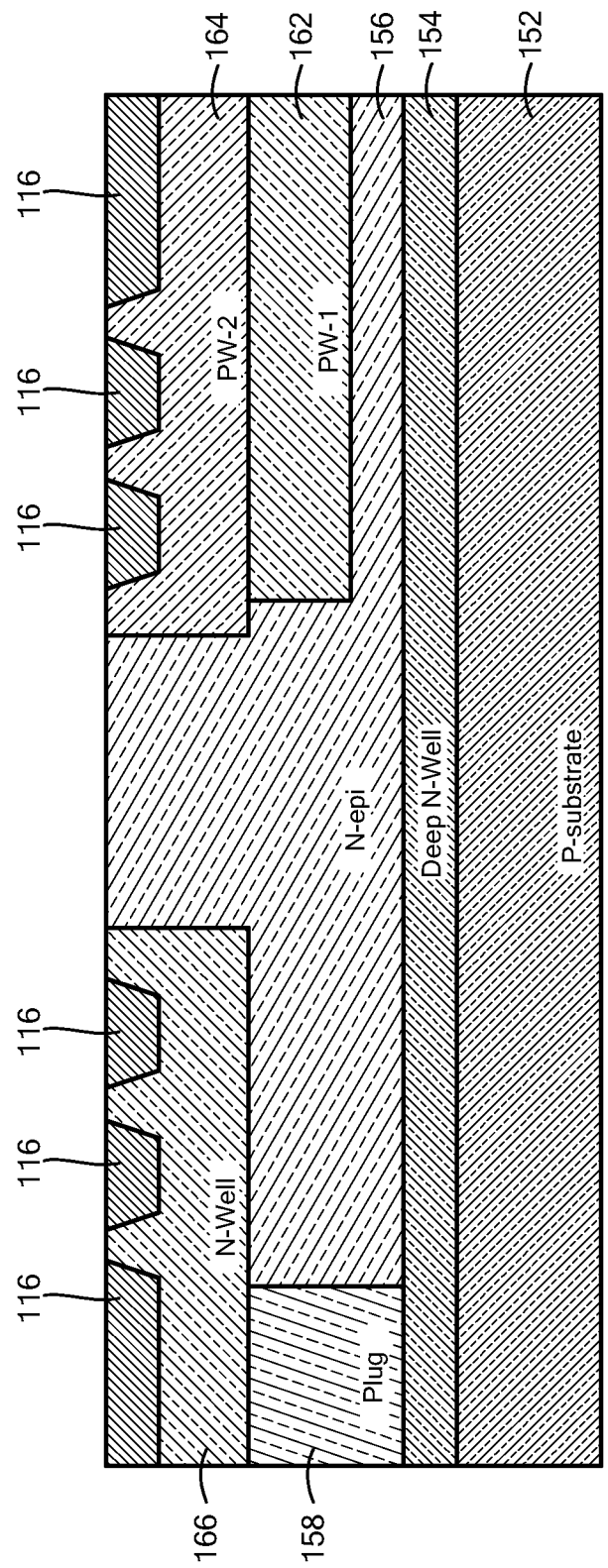
Figure 3H:
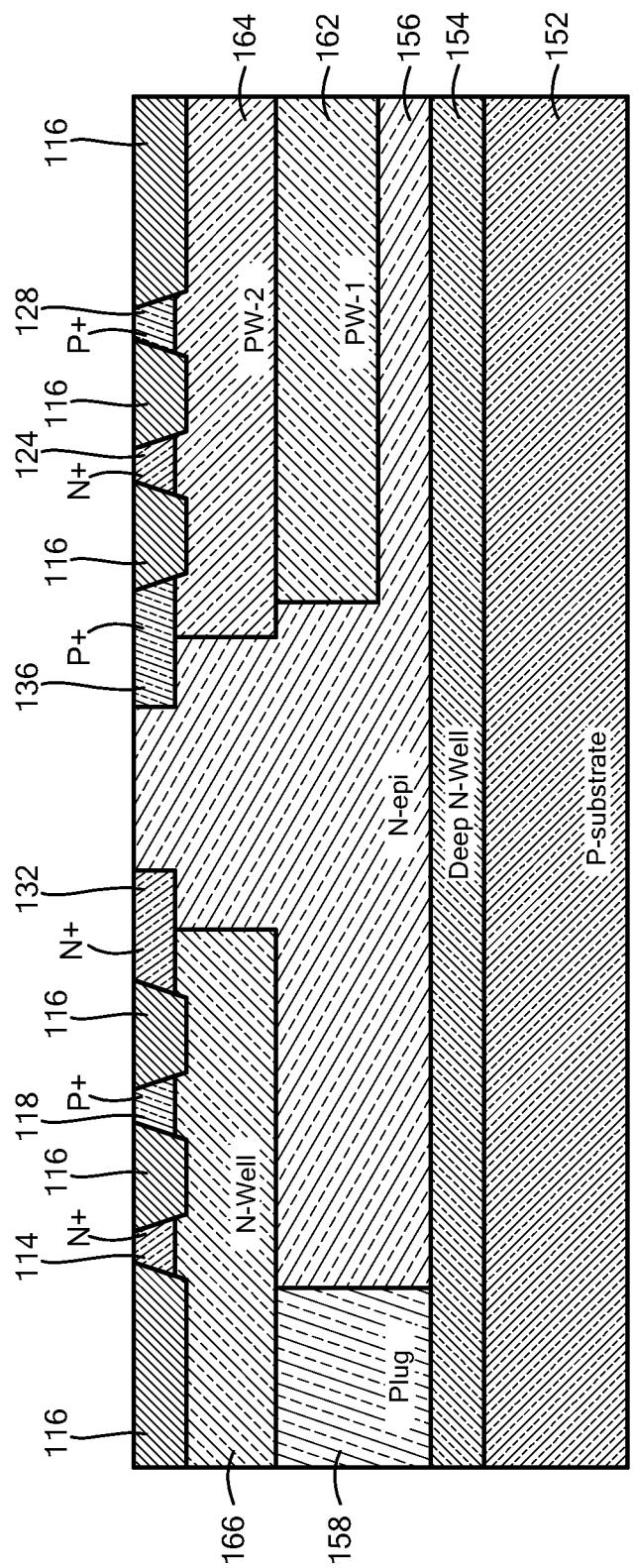

Process 200 forms an N-well and a second P-well (222) and forms the N+ and P+ regions (224). For example, the N-well 166 and the second P-well 164 are formed by diffusion (FIG. 3G). In another example, the N-well 166 and the second P-well 164 are formed by high energy implantation (FIG. 3G). The second P-well is shallower and higher doped that the first P-well 156. The N+ region 114, the P+ region 116, the N+ region 132, the P+ region 136, the N+ region 124 and P+ region 128 are formed by implant and/or diffusion (FIG. 3H). In particular, during this processing step the desired distances D1, D2 and D3 are used in the formation of the N+ region 132 and the P+ region 136.

Figure 4:
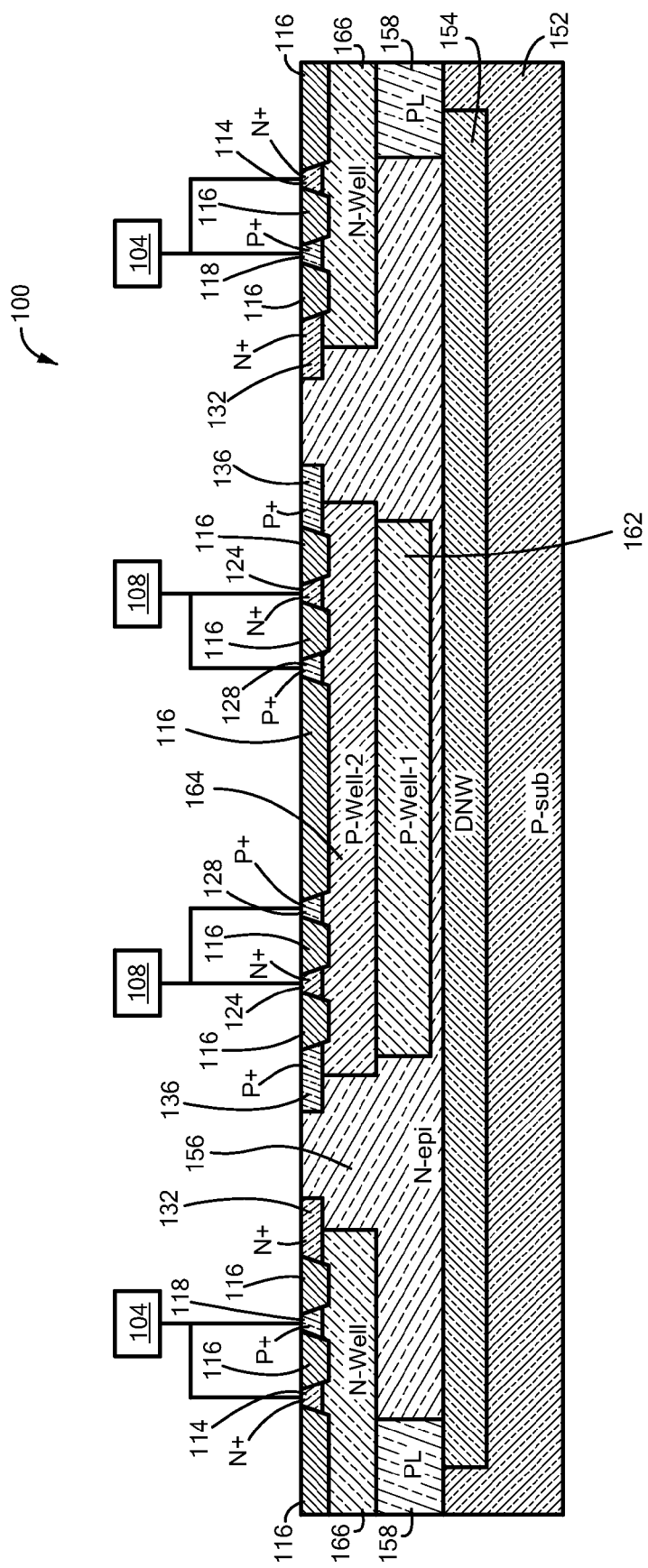
FIG. 4 is a block diagram of an example of a symmetrical structure that includes the NS-SCR of FIG. 1 and a mirrored NS-SCR version.

Referring to FIG. 4, while FIG. 1 shows a single NS-SCR, a complete structure may be fabricated that includes the NS-SCR 100 of FIG. 1 and a mirrored version of the NS-SCR 100 of FIG. 1.

Elements of different embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

What is claimed is:

1. A silicon-controller rectifier (SCR) comprising:
a first N+ region;
a first P+ region, an anode terminal of the SCR connecting to the first N+ region and the first P+ region;
a second N+ region;
a second P+ region, a cathode terminal of the SCR connecting to the second N+ region and the second P+ region;
a P+/Intrinsic/N+ (PIN) diode disposed between the first P+ region and the second N+ region, the PIN diode comprising a third N+ region, a third P+ region and an intrinsic material disposed between the third N+ region and the third P+ region,
wherein a first distance between the third N+ region and the third P+ region controls the trigger voltage of the SCR, and
wherein a second distance corresponding to a length of each of the third P+ region and the third N+ region controls the holding voltage of the SCR.

2. The SCR of claim 1, further comprises:
an N-well coupled to the first N+ region and the first P+ region and the third N+ region;
a first P-well; and
a second P-well having a higher doping than the first P-well and coupled to the second N+ region, second P+ region, the third P+ region and the first P well.

3. The SCR of claim 2, wherein the N-well extends half the length of the third N+ region and the second P-well extends to half the length of the third P+ region.

4. The SCR of claim 3, wherein a third distance is equal to a length of the third N+ region not directly connected to the N-well, wherein the third distance is also equal to a length of the third P+ region not directly connected to the second P-well, and the third distance controls the holding voltage of the SCR.

5. The SCR of claim 2, further comprising an N-type plug coupled to the N-well and the intrinsic material.

6. The SCR of claim 5, wherein the N-type plug is further coupled to a deep N-well.

7. The SCR of claim 6, wherein the N-type plug is further coupled to a P-substrate.

8. The SCR of claim 1, wherein the intrinsic region is an N-type epitaxial material.

9. The SCR of claim 1, wherein the SCR has no snapback.

* * * * *